United States Patent
Kusano et al.

(10) Patent No.: US 6,782,011 B2
(45) Date of Patent: Aug. 24, 2004

(54) LENSED POLARIZATION MAINTAINING FIBER AND ITS MANUFACTURING METHOD, AND SEMICONDUCTOR LASER MODULE USING THE SAME AND ITS MANUFACTURING METHOD

(75) Inventors: Teruo Kusano, Tokyo (JP); Toshio Mugishima, Tokyo (JP); Jun Miyokawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 128 days.

(21) Appl. No.: 10/113,290

(22) Filed: Apr. 2, 2002

(65) Prior Publication Data

US 2002/0154413 A1 Oct. 24, 2002

(30) Foreign Application Priority Data

Apr. 2, 2001 (JP) .................................... 2001-103804

(51) Int. Cl.[7] .............................................. H01S 3/30
(52) U.S. Cl. .......................... 372/6; 385/102; 385/107; 385/108; 385/119; 65/387
(58) Field of Search .................. 372/6, 101; 385/102, 385/119, 107, 108; 65/387

(56) References Cited

U.S. PATENT DOCUMENTS

| | | | | | |
|---|---|---|---|---|---|
| 4,426,129 A | * | 1/1984 | Matsumura et al. | ...... | 350/96.33 |
| 4,529,426 A | * | 7/1985 | Pleibel et al. | ................. | 65/3.11 |
| 4,896,941 A | * | 1/1990 | Hayashi et al. | .......... | 350/96.25 |
| 5,699,377 A | * | 12/1997 | Pan | ............................ | 372/92 |
| 6,301,406 B1 | | 10/2001 | Irie et al. | | |
| 6,301,410 B1 | * | 10/2001 | Carberry et al. | .............. | 385/37 |
| 6,317,547 B1 | | 11/2001 | Pavlath et al. | | |
| 6,317,550 B2 | | 11/2001 | Irie et al. | | |

FOREIGN PATENT DOCUMENTS

| | | | | | |
|---|---|---|---|---|---|
| JP | 2000-028852 | * | 1/2000 | ............ | G02B/6/32 |
| JP | 2000-221341 | * | 8/2000 | ............ | G02B/6/10 |

* cited by examiner

*Primary Examiner*—Don Wong
*Assistant Examiner*—Leith Al-Nazer
(74) *Attorney, Agent, or Firm*—Oblon, Spivak, McClelland, Maier & Neustadt, P.C.

(57) ABSTRACT

A lensed polarization maintaining fiber having a lens on an end thereof has a core, two stress-applied regions disposed on both sides of the core, respectively, and a clad containing the core and stress-applied regions. The lens has at least an inclined face, the inclined face including an edge. Each of the stress-applied regions is exposed on the inclined face except the edge.

26 Claims, 8 Drawing Sheets

LENSED POLARIZATION MAINTAINING FIBER AND ITS MANUFACTURING METHOD, AND SEMICONDUCTOR LASER MODULE USING THE SAME AND ITS MANUFACTURING METHOD

BACKGROUND OF THE INVENTION

1. Field of the Invention

The present invention relates to a lensed polarization maintaining fiber and its manufacturing method as well as a semiconductor laser module using the same and its manufacturing method.

2. Description of the Related Art

There are a variety of polarization maintaining fibers (PMFs) such as the PANDA fiber and jacket core fiber, which are designed to maintain the polarization of the light propagating through these fibers.

Some of those polarization maintaining fibers are lensed polarization maintaining fibers of which fiber ends are formed into lens shapes to provide high light-coupling efficiency when light is incident upon the fiber end.

With regard to those fibers of which fiber ends are formed into wedge-like lens shapes, Japanese Patent Laid-Open Publication Nos. 2000-28852 and 2000-221341 have disclosed a configuration in which the stress-applied regions are laid on the ridgeline of the wedge.

An object of the present invention is to provide a lensed polarization maintaining fiber of stable quality and its manufacturing method. The other object of the present invention is to provide a semiconductor laser module using such a lensed polarization maintaining fiber and its manufacturing method.

SUMMARY OF THE INVENTION

A first aspect of the present invention is to provide a lensed polarization maintaining fiber having a lens on an end thereof, the fiber comprises a core, a pair of stress-applied regions, the stress-applied regions disposed on both sides of the core, respectively, and a clad containing the core and stress-applied regions. The lens has at least an inclined face, the inclined face including an edge, each of the stress-applied regions being exposed on the inclined face except the edge.

A second aspect of the present invention is to provide a method for manufacturing a lensed polarization maintaining fiber having a lens on an end thereof, the method comprising the steps of forming a fiber end by cleaving a polarization maintaining fiber having a core, a pair of stress-applied regions disposed on both sides of the core, respectively, and a clad containing the core and stress-applied regions, and forming the fiber end into the lens. The lens has at least an inclined face, the inclined face including an edge, each of the stress-applied regions being exposed on the inclined face except the edge.

A third aspect of the present invention is to provide a semiconductor laser module comprises a package, a semiconductor laser device housed in the package, the semiconductor laser device having an active layer and a laser beam emitting face including one end of the active layer, and a lensed polarization maintaining fiber having a lens on one end thereof. The lens is opposed to the beam emitting face for receiving light emitted from the laser device and guiding the light to an outside of the package. The fiber comprises a core, a two stress-applied regions disposed on both sides of the core, respectively, and a clad containing the core and stress-applied regions. The lens has inclined faces, each of the stress-applied regions being exposed within one of the inclined faces.

A fourth aspect of the present invention is to provide a semiconductor laser module manufacturing method comprising the step of fixing a semiconductor laser device the semiconductor laser device having an active layer and a laser beam emitting face including one end of the active layer, and a lensed polarization maintaining fiber having a lens on one end thereof, the light emitting face being opposed to an end of the fiber. The fiber comprises a core, a two stress-applied regions disposed on both sides of the core, respectively, and a clad containing the core and stress-applied regions. The lens has inclined faces, each of the stress-applied regions being exposed within one of the inclined faces.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

DETAILED DESCRIPTION

Figure 1:
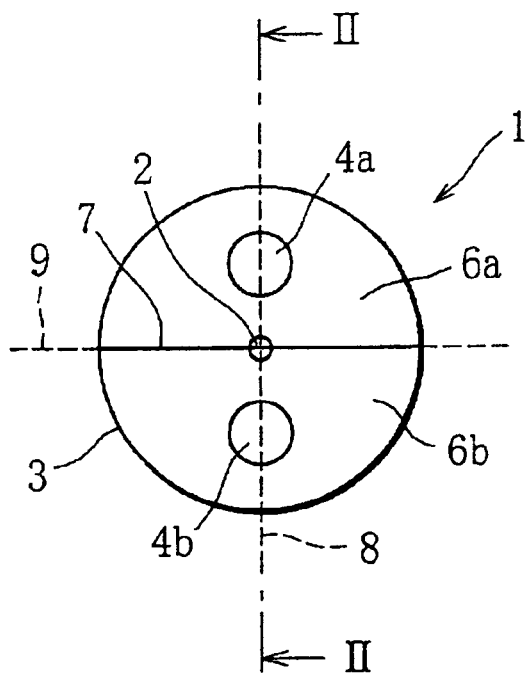
FIG. 1 is a plan view perpendicular to the longitudinal direction of a lensed polarization maintaining fiber according to an embodiment of the present invention.

Now an embodiment of the present invention is described with reference to the accompanying drawings.

FIGS. 1–4 illustrate a lensed polarization maintaining fiber 1 (hereinafter referred to as PMF 1) which is an embodiment of the present invention.

As shown in FIGS. 1–4, PMF 1 is the so-called PANDA fiber. PMF 1 has a core extending in a longitudinal direction thereof. Along both sides of the core 2, two stress-applied regions 4 are disposed, respectively, and those of the core 2 and the stress-applied regions 4 are contained together in a clad 3.

In general, the stress-applied regions 4a, 4b are made of boron-doped silicon oxide, and the mechanical strength of the stress-applied regions 4a, 4b is lower than those of the core 2 and clad 3 which are made of glass so that one uniaxial stress is applied to the core 2 in a direction perpendicular to the longitudinal direction.

The end of the PMF 1 is formed into a wedge-shaped lens having two planar inclined faces 6a, 6b. An end surface of the stress-applied region 4a is exposed on the inclined face 6a, while an end surface of the stress-applied region 4b is exposed on the inclined face 6b. Either of the stress-applied regions 4a, 4b is not exposed on the ridgeline 7 where the inclined faces 6a, 6b intersect each other.

The core 2 exposed on the end of the PMF 1 is precisely polished so that the end face of the core 2 includes a cleave-cut face.

A tensile stress is applied to the core 2 in the direction of an axial line 8 connecting the stress-applied regions 4a, 4b (see FIG. 1) as the uniaxial stress. This axis is called the slow axis. An axis 9 perpendicular to the slow axis 8 is called the fast axis. These axes 8, 9 are both polarization maintaining axes such that the light whose polarization plane is parallel to one of those axes can propagate keeping the polarization plane.

Such PMF 1 is manufactured as below.

Figure 5:
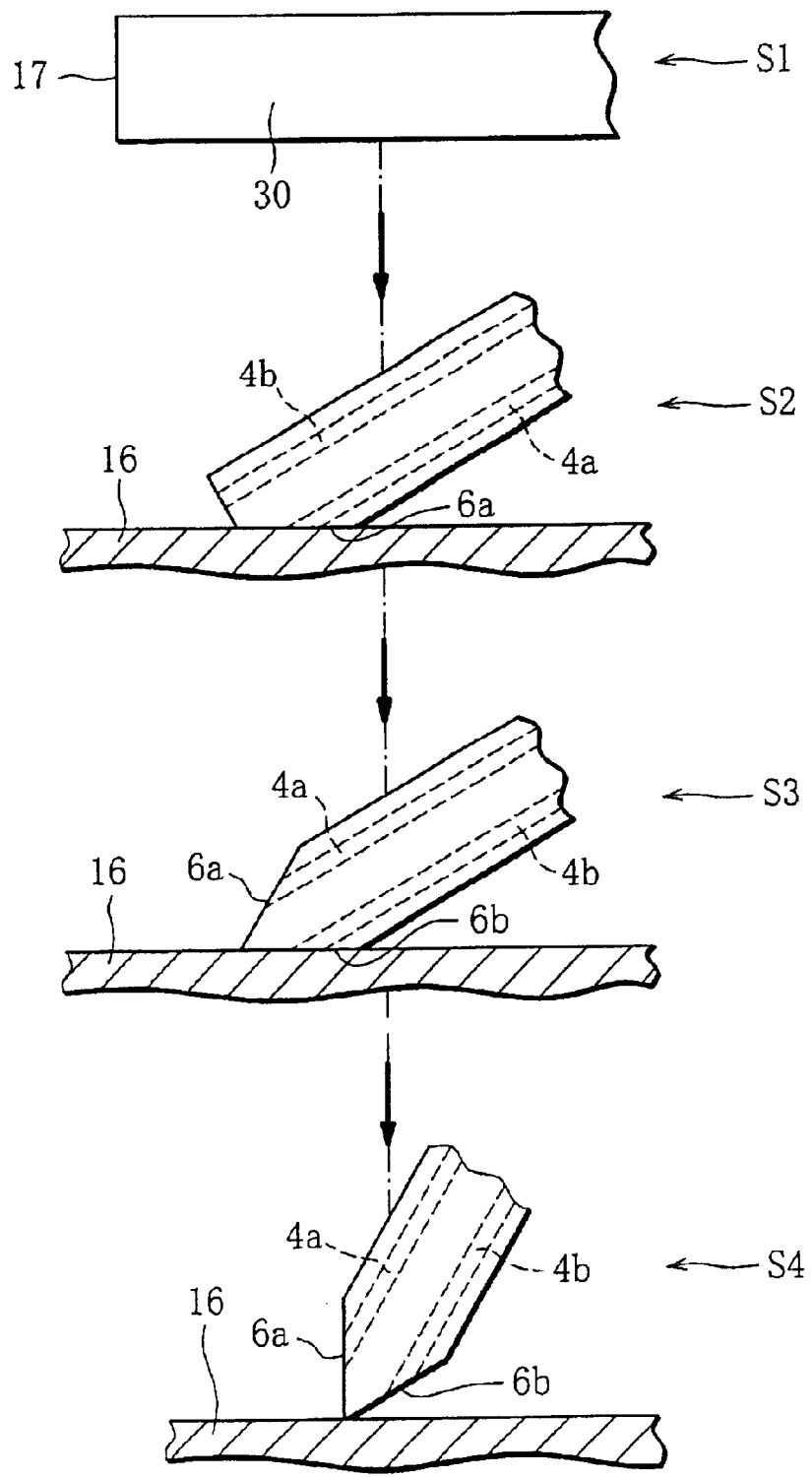
FIG. 5 illustrates the steps for manufacturing the fiber shown in FIG. 1.

Referring now to step Sl shown in FIG. 5, a polarization maintaining fiber 30 is cleaved with a fiber cutter and the likes to form the cleave-cut face 17 at the end thereof. At this moment, the stress-applied regions 4a, 4b that are exposed at the end of the fiber 30 occasionally have cracks.

Subsequently, at step S2, an inclined face 6a is formed by grinding the fiber end against the grinder face 16 of a running grinder tape. After the formation of the inclined face 6a, the fiber end is turned 180 degrees around its longitudinal direction, and as shown at step S3, the fiber end is again pressed against the grinder face 16 of the running grinder tape to form the inclined face 6b.

The inclined faces 6a, 6b are formed so that either of the stress-applied regions 4a, 4b does not expose across the boundary area of the inclined faces 6a, 6b or the ridgeline 7 where the inclined faces 6a, 6b intersect each other. In the present invention, the fiber is ground at a predetermined angle. Therefore the stress-applied regions 4a, 4b are sufficiently ground and the cracks made during cleaving are removed. Since both inclined faces 6a, 6b are simple flat planes, it is easy to grind the fiber 30 so as to obtain these faces 6a, 6b. As a result, new cracks or flaws are not likely to arise by grinding compared to a complex grinding process.

Afterward, as shown in step S4, the core 2 and vicinity thereof are pressed against the grinder face 16 of the running grinder tape to form a precise, optimal lens shape. At this moment, the whole area of the exposed core 2 may be polished or part of the central cleave-cut face 17 of the core 2 may be left unpolished.

Figure 6:
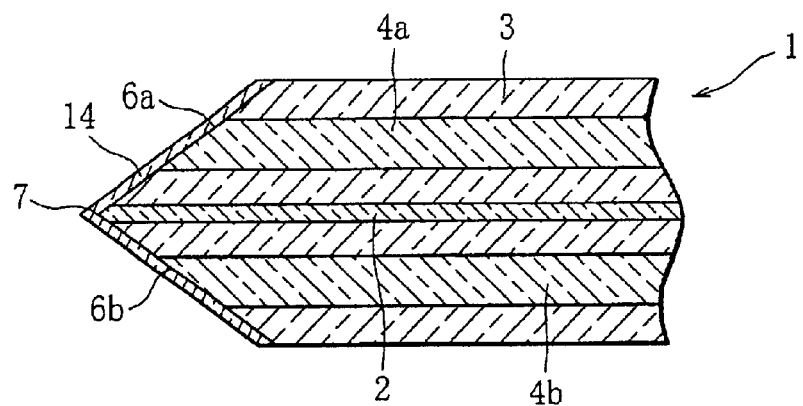
FIG. 6 is a cross-sectional view of the fiber shown in FIG. 1 having an anti-reflection coating.

Thus the grinding and polishing process is over. Then, as shown in FIG. 6, an anti-reflection coating 14, which is a multi-layer of silicon oxide and tantalum oxide, for example, may be coated on the whole area of the inclined faces 6a, 6b.

The reflection of the light incident upon the inclined faces 6a, 6b is thereby prevented.

PMF 1 which has been fabricated in this way no longer has cracks that were made during cleaving, and there is no flaw on the surface. Since this fiber is crack-free, there will be no crack growth during use and PMF 1 of stable quality will be available.

Figure 7:
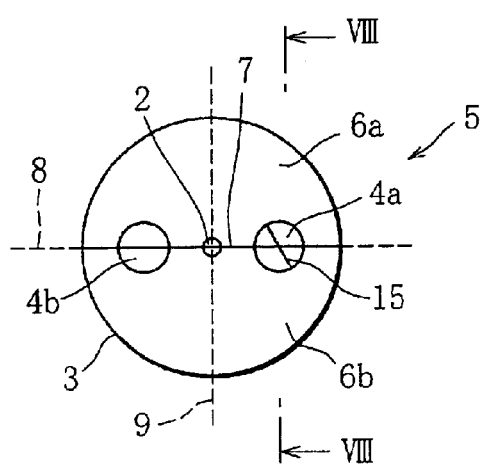
FIG. 7 is a plan view illustrating a problem of the lensed polarization maintaining fiber.
Figure 8:
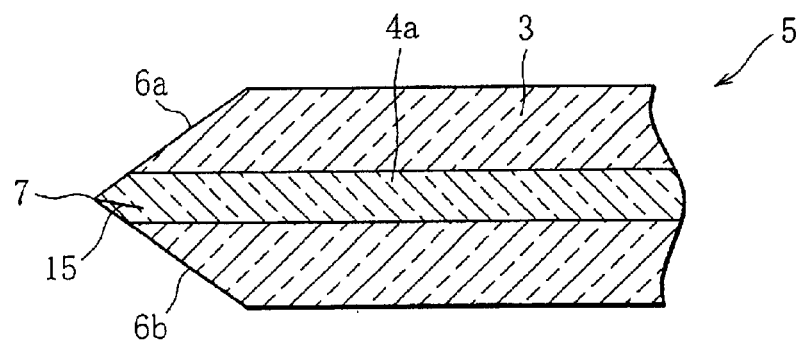
FIG. 8 is a cross-sectional view taken along the VIII—VIII line of the fiber shown in FIG. 7.

On the other hand, referring to FIGS. 7 and 8, there is a lensed polarization maintaining fiber 5 (hereinafter referred to PMF 5) where the stress-applied regions 4a, 4b are exposed in the boundary between the inclined faces 6a, 6b. Such a fiber occasionally has cracks 15 (see FIGS. 7 and 8) on the surface of the stress-applied regions 4a, 4b that are exposed at the fiber end. As a result, there may be fluctuations in quality in such PMF 5.

The inventors have found that cracks in the stress-applied regions 4a, 4b are made during the cleave-cut of the polarization maintaining fiber prior to the step of forming a lens shape in the fiber end.

Even in PMF 5, some of the cracks can be removed by polishing the inclined faces 6a, 6b, depending on the position and depth of each crack. However, it is not ensured that all the cracks can be removed by polishing. Further, as to PMF 5, though it is possible to completely eliminate all cracks by grinding a large portion of the fiber end and then forming the lens shape, it is time consuming.

Contrary, in case of PMF 1, since substantial grindings of the stress-applied regions 4a, 4b are incorporated in forming the inclined faces 6a, 6b, this method provides increased productivity. Indeed, the tact time can be reduced to sub-multiples.

In cases like PMF 5 where the stress-applied regions 4a, 4b are exposed as convex areas on the ridgeline 7 of the wedge, these convex stress-applied regions 4a, 4b may be chipped and likely to have new cracks.

In contrast, in case of PMF 1 according to the present invention, the exposed stress-applied regions 4a, 4b are not convex but approximately flat. Thus such problems are less likely to occur.

Particularly when it is needed to leave the cleave-cut face 17 in part of the core 2 exposed at the fiber end, it is impossible to deeply grind the fiber end. Thus, in order to deeply grind the stress-applied regions 4a, 4b, it is preferable to grind the fiber so that the line connecting the centers of the stress-applied regions 4a, 4b (namely, the slow axis 8 of the polarization maintaining axis) becomes perpendicular to the ridgeline 7 of the wedge when the fiber is viewed from the longitudinal direction, as shown in FIG. 1.

Further, the angle θ (see FIG. 4) that the inclined faces 6a, 6b make in PMF 1 should be, preferably, 50–100 degrees, to allow a deep grinding of the stress-applied regions 4a, 4b.

Figure 2:
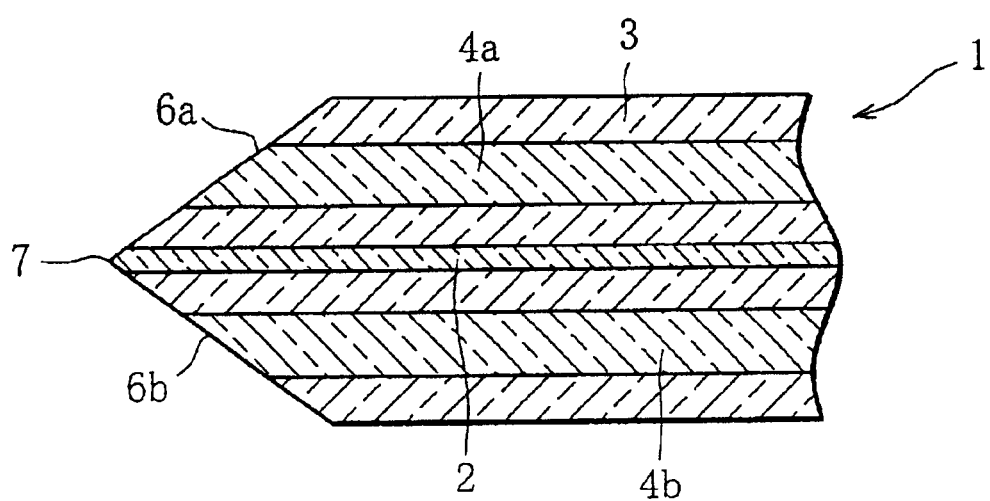
FIG. 2 is a cross-sectional view taken along the II—II line of the fiber shown in FIG. 1.
Figure 9:
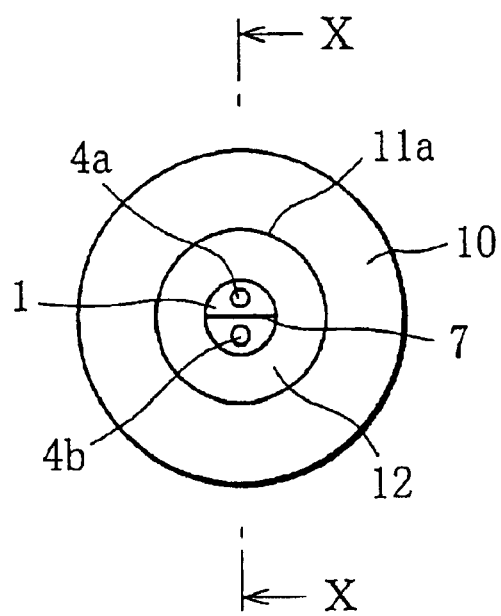
FIG. 9 is a plan view of the fiber shown in FIG. 1 fixed in a ferrule.
Figure 10:
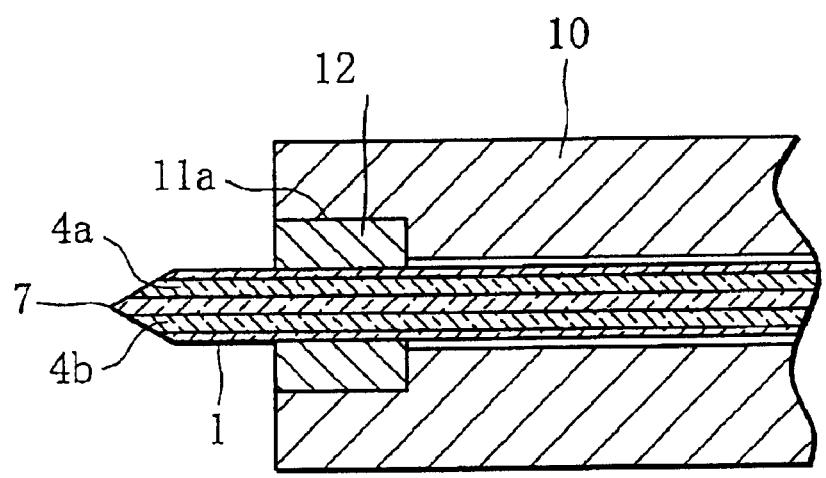
FIG. 10 is a cross-sectional view taken along the X—X line of the fiber shown in FIG. 9.

Referring now to FIGS. 9 and 10, an example is shown in the plan and cross-sectional side views where PMF 1 of FIGS. 1 and 2 is fixed in a ferrule 10. The ferrule 10 is made of a metallic material made of a Fe—Ni—Co alloy such as KOVAR (trademark) and has a fiber insertion throughhole 18 along its longitudinal direction. At the end of the ferrule 10, a solder reservoir 11a of a circle shape is formed by machining, for example. The PMF 1 has gold plating (not shown) on its outer side surface and is inserted in the fiber insertion throughhole 18 of the ferrule 10. After the solder reservoir 11a is filled with solder 12 made of Au—Sn or Pb—Sn alloy, for example, the gold-plated area of the PMF 1 is fixed on the ferrule 10 with the solder 12.

In many cases, part of the PMF 1 is inserted and fixed in the ferrule 10 for practical use.

Figure 11:
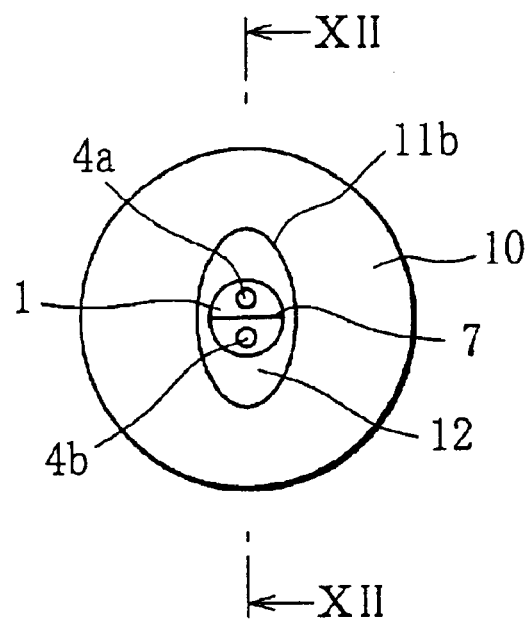
FIG. 11 is a plan view of the lensed polarization maintaining fiber fixed in a ferrule in accordance with another embodiment of the present invention.
Figure 12:
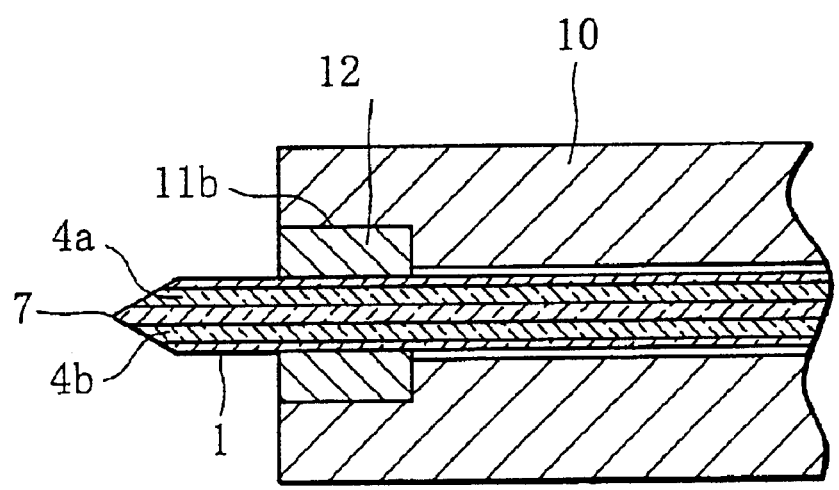
FIG. 12 is a cross-sectional side view taken along the XII—XII line of the fiber shown in FIG. 11.

As shown in FIGS. 11 and 12 demonstrating another example of the present invention, the ferrule 10 may have a solder reservoir 11b that has an oval cross-section. In this example, PMF 1 is fixed in the ferrule 10 so that the short axis of the oval coincide with the ridgeline 7 of the wedge of PMF 1. According to this configuration, the tensile stress of the solder 12 works in the same direction as that of the stress-applied regions 4a, 4b. Therefore degradation of the polarization maintaining characteristics (for example, the extinction ratio) of the light propagating through PMF 1 is prevented.

In order to maintain the strength for fixing PMF 1 provided by the solder 12 and prevent the degradation of polarization maintaining characteristics, preferably, the short axis of the solder reservoir lib falls within a range of 0.13–0.15 mm and its long axis is approximately 1.5–2.0 times as long as the short axis, when the diameter of PMF 1 is 0.125 mm.

Figure 3:
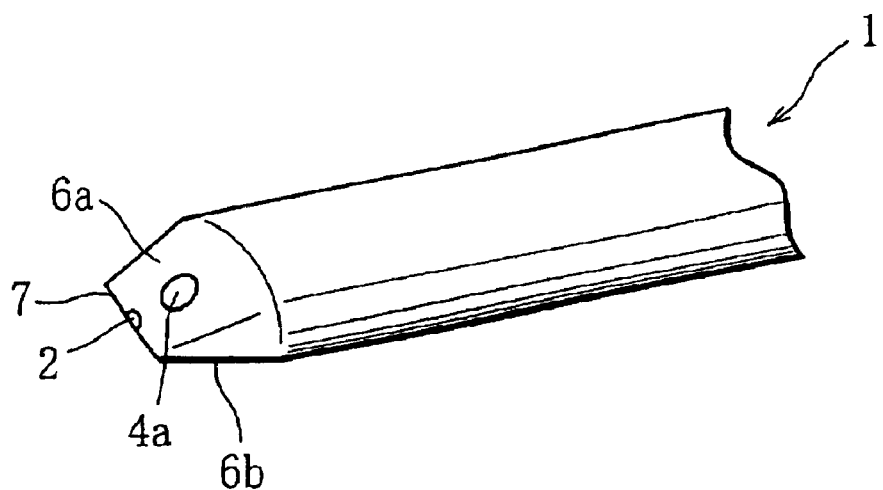
FIG. 3 is a perspective view of the fiber shown in FIG. 1.
Figure 13:
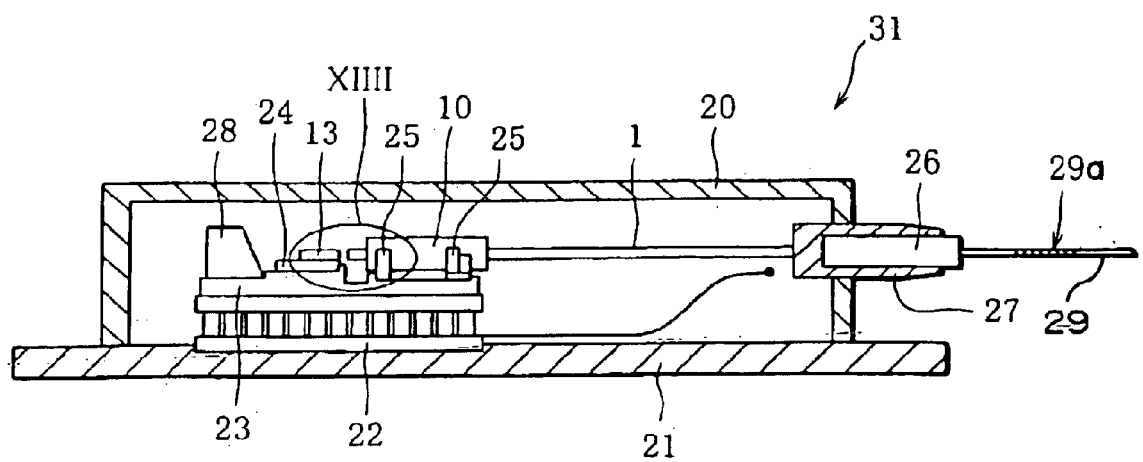
FIG. 13 is a cross-sectional side view of the semiconductor laser module having the fiber shown in FIG. 1.
Figure 14:
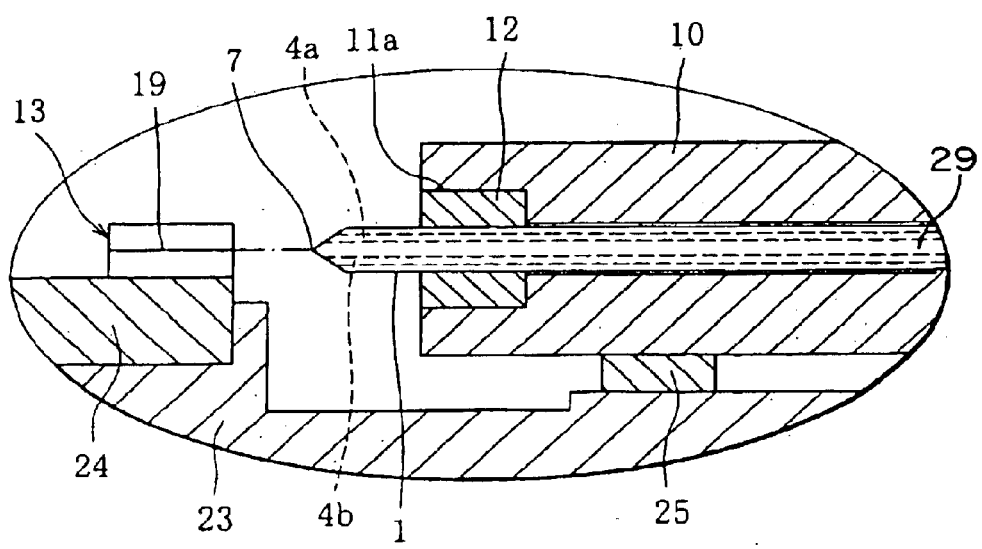
FIG. 14 is an enlarged cross-sectional view of the XIIII region in FIG. 13.

FIGS. 13 and 14 show a semiconductor laser module 31 (hereinafter referred to module 31) that is an embodiment according to the present invention. As shown in FIGS. 1–3, the module 31 has a package 20. A thermo module 22 that controls the temperature of a semiconductor laser device 13 is fixed with solder onto the bottom plate 21 of the package 20. A metallic base 23 is fixed onto this thermo module with solder. The laser device 13 is mounted on them via a heat sink 24. On the base 23, PMF 1 explained with reference to FIGS. 1 and 2 is fixed via the ferrule 10 explained with reference to FIGS. 9, 10 and FIGS. 11, 12, and a fixing member 25. The ferrule 10 is fixed on the fixing member 25 by the laser welding, and the fixed member 25 is fixed on the base 23 also by the laser welding. The lens formed on the end of PMF 1 is opposed to the light emitting face of the device 13. As shown in FIG. 14, the active layer 19 of the laser device 13 lies in the same level as the ridgeline 7 of the PMF 1.

A monitor photodiode 28 that is mounted on a chip carrier is located on the base 23 to receive the monitoring light transmitted from the back face opposed to the light emitting face of the laser device 13 and monitor the light output from the laser device 13.

The fiber end of PMF 1 has an anti-reflection coating 14 (see FIG. 6).

Another end of PMF 1 is fixed in one end of a second ferrule 26, while the ferrule 26 is fixed with solder on the package 20 via a sleeve 27. The optical fiber 29 extends from the other end of the second ferrule 26 toward the outside of the package 20.

As shown in FIG. 13, the optical fiber 29 may have a resonator 29a. The resonator 29a is formed in the position best in terms of the optical design for the optical fiber 29, for example, a position where the laser module 13 oscillates in a stable state.

According to the module 31, the laser beam emitted from the light emitting face of the semiconductor laser device 13 and incident on the lens formed on the end of the PMF 1 is condensed into the core of the PMF 1. Then the laser beam travels through the PMF 1 and the optical fiber 29, and is provided for the predetermined use.

In order to preserve the linear polarization of the laser beam and enhance the optical coupling efficiency between the device 13 and PMF 1, the PMF 1 preferably have a configuration in which the line connecting the centers of the stress-applied regions 4a, 4b (slow axis 8) intersects the ridgeline 7 of the wedge at right angles, as shown in FIG. 1 when the fiber is viewed from the longitudinal direction.

Further, in this configuration as shown in FIG. 14, the ridgeline 7 of the wedge of PMF 1 lies in the same plane as the active layer 19 of the semiconductor laser device 13, in other words, the slow axis 8 is laid in parallel with the normal line of the active laser 19.

The characteristics regarding the extinction ratio were studied on PMF 1 of the embodiment of the invention, using the semiconductor laser module 31 shown in FIGS. 13 and 14.

In this measurement, the module 31 of the present embodiment employing the ferrule 10 having a solder reservoir 11a of which cross-section is a circle as shown in FIGS. 9 and 10.

Data samples were taken as many as 30.

Figure 15:
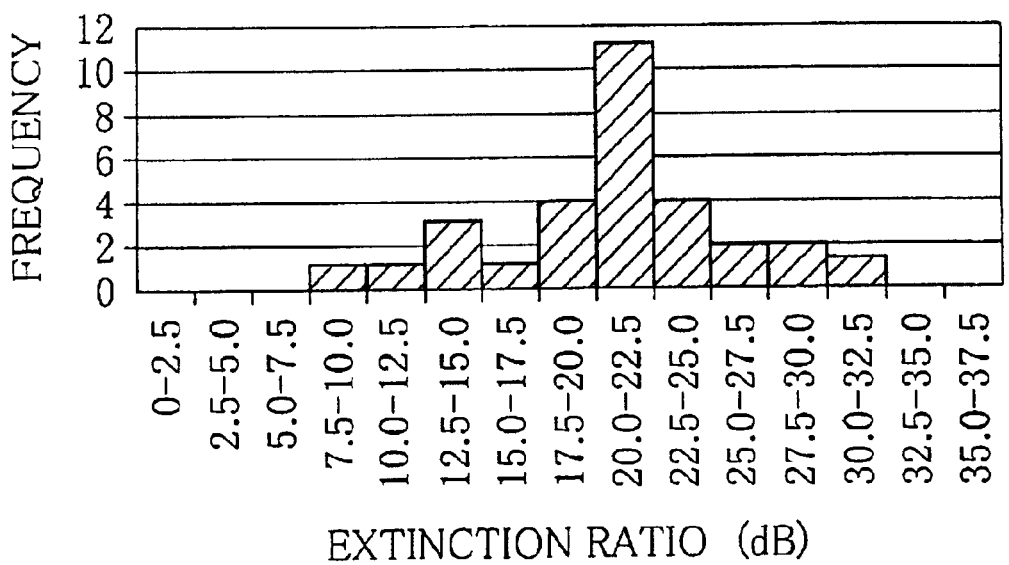
FIG. 15 is a graph illustrating the measurement results of the extinction ratio of the module shown in FIG. 13.

FIG. 15 is the graph illustrating the above measurement results, where the ordinate represents frequency and the abscissa represents extinction ratio. The average of extinction ratios was 20.8 dB.

FIG. 15 indicates that PMF 1 of the present embodiment had a performance with respect to the extinction ratio as good as that of the prior art polarization maintaining fibers. In addition, when the monitor light emitted from the reflection face opposed to the light emitting face of the device 13 was measured in terms of an electric current (Im), the average fluctuation in Im was 4.3% in the present embodiment, which was similar to the conventional level.

With respect to the optical coupling efficiency, there was almost no difference between PMF 1 of the present embodiment and the prior art.

In PMF 1 of the present embodiment and the semiconductor laser module 31 using the same, mechanical defects such as cracks and chipping can be prevented in the stress-applied regions because each stress-applied region is exposed on only one inclined face and is not exposed on the ridgeline. Thus it becomes possible to reduce the defective fraction and stabilize the quality of the polarization maintaining fiber, while maintaining the optical performance at the same level as that of the prior art fibers.

The lensed polarization maintaining fiber and its manufacturing method as well as the semiconductor laser module using the lensed polarization maintaining fiber and its manufacturing method in accordance with the present invention are not limited to those described in the above embodiments.

Figure 16:
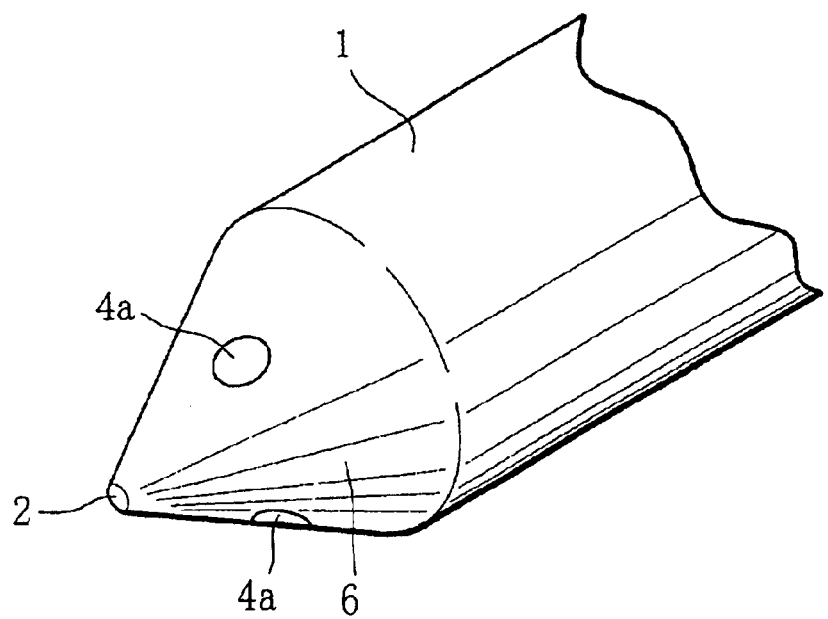
FIG. 16 is a perspective view of the lensed polarization maintaining fiber according to a variation of the present invention.

For example, as shown in FIG. 16, the lens formed on the end of PMF 1 may have a conical lens shape of which apex is the exposed face of the core 2. In this case, the whole side surface of the cone works as an inclined face 6. According to this configuration, all the stress-applied regions 4a, 4b are formed on the same inclined face 6. Therefore the stress-applied regions 4 are deeply cut by grinding and the cracks are thereby removed.

The lens shape is determined according to the respective requirements of the optical cross-section and other factors.

Figure 4:
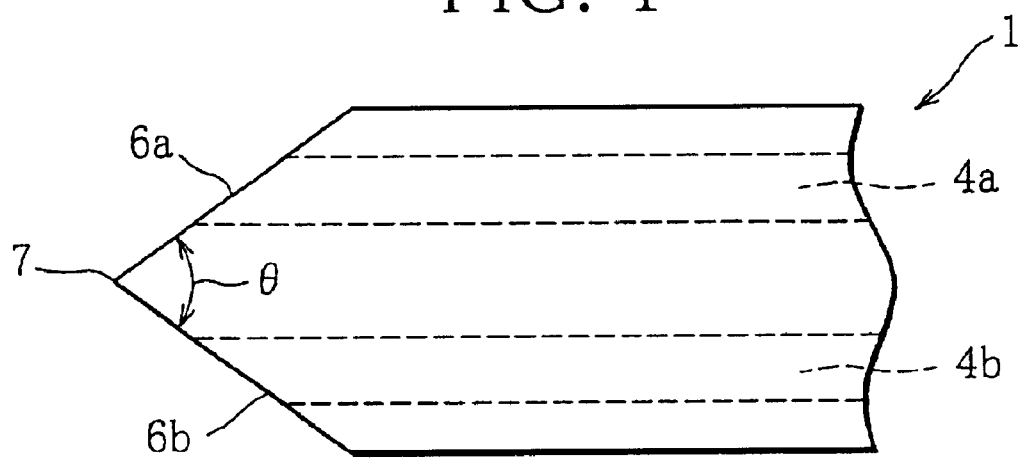
FIG. 4 is a side view of the fiber shown in FIG. 1.

Further, with respect to the inclined faces 6a, 6b shown in FIG. 4, part of them or the whole of them may be formed into curvatures to control the reflection properties of the laser beam.

Yet further, as shown in FIG. 1, with the fiber being projected onto a plane perpendicular to its longitudinal direction, the angle made by the line connecting the centers of the stress-applied regions 4 and the ridgeline line 7 of the wedge may be other than 90 degrees. For example, it may be 45 degrees to reduce polarity (namely, depolarization) according to individual needs.

More, the end of the fiber may be ground by any methods. For example, a disk grinder and a plate grinder may be used, instead of the running grinder tape, for rotary grinding and reciprocative grinding. In case of a reciprocative grinding, the polarization maintaining fiber 30 which is held by jigs may be ground by moving it relative to the fixed grinder plate. The materials for these running grinder tape and grinder plate may be one of paper, cloth, grind stone, metals and others. The end of the fiber may be machined by a dry etching or chemical etching, instead of a mechanical grinding.

Moreover, the solder reservoir of the ferrule used in the semiconductor laser module 31 may have an oval shape.

What is claimed is:

1. A lensed polarization maintaining fiber having a lens on an end thereof, the fiber comprising:
    a core;
    a pair of stress-applied regions disposed on opposite sides of the core, respectively; and
    a clad containing said core and stress-applied regions,
    wherein the lens has at least one inclined face including an edge that defines an end of at least a portion of said at least one inclined face, and
    each of said stress-applied regions is exposed-on the at least one inclined face, but not exposed on the edge.

2. The fiber according to claim 1, wherein:
    said lens has a wedge shape; and
    the at least one inclined face includes a pair of inclined faces.

3. The fiber according to claim 2, further comprising:
    an anti-reflection coating formed on said lens.

4. The fiber according to claim 3, wherein:
    said pair of stress-applied regions includes boron-doped silica.

5. The fiber according to claim 4, wherein:
    an angle formed by said pair of inclined faces is in an inclusive range of 50 through 100 degrees.

6. The fiber according to claim 5, wherein:
    a portion of the core is exposed on said lens at a cleave-cut face portion of said fiber.

7. The fiber according to claim 2, wherein:
    said pair of stress-applied regions are disposed such that a line connecting centers of said pair of stress-applied regions would intersect a ridgeline of said wedge shape at a 90 degree angle when said fiber is viewed from a longitudinal direction thereof.

8. The fiber according to claim 1, wherein:
    said lens has a conical shape;
    the at least one inclined face being a side face; and
    said edge being an apex.

9. A method for manufacturing a lensed polarization maintaining fiber from a polarization maintaining fiber, the method comprising the steps of:
    cleaving the polarization maintaining fiber to make a fiber end, said polarization maintaining fiber having a core, a pair of stress-applied regions disposed on opposite sides of the core, and a clad containing said core and stress-applied regions; and
    forming a lens from said fiber, including forming at least one inclined face, the at least one inclined face including an edge at an end portion thereof, and exposing each of said stress-applied regions on the inclined face, but not on the edge.

10. The method of claim 9, wherein:
    said step of forming at least one included face includes forming a pair of inclined faces so as to make said lens in a wedge shape.

11. The method of claim 10, further comprising a step of:
    applying an anti-reflection coating on said pair of inclined faces.

12. The method of claim 10, wherein:
    said exposing step includes exposing said pair of stress-applied regions, wherein said stress-applied regions include boron-doped silica.

13. The method of claim 10, wherein:
    said step of forming a pair of inclined faces includes setting an angle between the pair of inclined faces to be in an inclusive range of 50 through 100 degrees.

14. The method of claim 10, wherein:
    said exposing step includes exposing the core at the fiber end formed in said cleaving step.

15. The method of claim 10, wherein said step of forming a pair of inclined faces includes forming the pair of inclined faces at predetermined positions such that a line connecting centers of said pair of stress-applied regions would intersect a ridgeline of said wedge shape at a 90 degree angle when said fiber is viewed from a longitudinal direction thereof.

16. The method of claim 9, wherein:
    said step of forming at least one included face includes forming a side face so as to make said lens in a conical shape, wherein said edge being an apex.

17. A semiconductor laser module comprising:
    a package;
    a semiconductor laser device housed in said package, the semiconductor laser device having an active layer and a laser beam emitting face included at one end of the active layer; and
    a lensed polarization maintaining fiber having a lens on one end thereof, the lens being opposed to the beam emitting face so as to receive light emitted from the laser beam emitting face of the semiconducting laser device and configured to guide the light to an outside of said package, said lensed polarization maintaining fiber having a core,
    a pair of stress-applied regions disposed on opposite sides of the core, and
    a clad containing the core and stress-applied regions, wherein
        the lens has at least one inclined face including an edge that defines an end of at least a portion of said at least one inclined face, and
        each of said stress-applied regions is exposed on the at least one inclined face, but not exposed on the edge.

18. The module according to claim 17, wherein:
    said lens has a wedge shape; and
    the at least one inclined face includes including a pair of inclined faces.

19. The module according to claim 18, further comprising: an anti-reflection coating formed on said lens.

20. The module according to claim 19, wherein said pair of stress-applied regions includes boron-doped silica.

21. The module according to claim 20, wherein:
    an angle formed by said pair of inclined faces is in an inclusive range of 50 through 100 degrees.

22. The module according to claim 18, wherein:
    a line connecting centers of said pair of stress-applied regions intersects a ridgeline of said wedge shape at a 90 degree angle when the fiber is viewed from a longitudinal direction, and a ridgeline of said wedge and said active layer are included in a same plane.

23. The module according to claim 18, wherein:
    a line connecting centers of said pair of stress-applied regions intersects a ridgeline of said wedge shape at an angle of 45 degrees when said fiber is viewed from a longitudinal direction thereof, and a ridgeline of said wedge is perpendicular to a normal line of said active layer.

24. The module according to claim 17, wherein: said lens has a conical shape;

the at least one inclined face being a side face; and said edge being an apex.

25. The module according to claim 17, wherein a portion of the fiber on which the core is exposed on said lens includes a cleave-cut face.

26. A method for manufacturing a semiconductor laser module, comprising the step of:

setting in a package a semiconductor laser device with a laser light emitting face opposed to a lensed polarization maintaining fiber, said light emitting face being set opposed to an end of said lensed polarization maintaining fiber, the lensed polarization maintaining fiber having a core, a pair of stress-applied regions on opposite sides of the core, and a clad containing said core and pair of stress-applied regions;

wherein the lens has at least one inclined face, including an edge that defines an end of at least a portion of said at least one inclined face, and each of said stress-applied regions is exposed on the at least one inclined face, but not exposed on the edge.

* * * * *